(12) United States Patent
Chang et al.

(10) Patent No.: US 8,053,865 B2
(45) Date of Patent: Nov. 8, 2011

(54) MOM CAPACITORS INTEGRATED WITH AIR-GAPS

(75) Inventors: Chung-Long Chang, Dou-Liu (TW); Ming-Shih Yeh, Chupei (TW); Chia-Yi Chen, Hsin-Chu (TW); David Ding-Chung Lu, Hsin-Chu (TW)

(73) Assignee: Taiwan Semiconductor Manufacturing Company, Ltd., Hisn-Chu (TW)

( * ) Notice: Subject to any disclaimer, the term of this patent is extended or adjusted under 35 U.S.C. 154(b) by 297 days.

(21) Appl. No.: 12/045,547

(22) Filed: Mar. 10, 2008

(65) Prior Publication Data
US 2009/0224359 A1    Sep. 10, 2009

(51) Int. Cl.
*H01L 29/72* (2006.01)
(52) U.S. Cl. ......... 257/532; 257/522; 257/758; 257/774
(58) Field of Classification Search .................. 257/522, 257/532, 758, 774
See application file for complete search history.

(56) References Cited

U.S. PATENT DOCUMENTS

| 5,208,725 | A |   | 5/1993 | Akcasu |
| 5,445,985 | A | * | 8/1995 | Calviello et al. .............. 438/171 |
| 6,110,791 | A | * | 8/2000 | Kalnitsky et al. ............. 438/379 |
| 6,117,747 | A |   | 9/2000 | Shao et al. |

* cited by examiner

*Primary Examiner* — Edward Wojciechowicz
(74) *Attorney, Agent, or Firm* — Slater & Matsil, L.L.P.

(57) ABSTRACT

An integrated circuit structure combining air-gaps and metal-oxide-metal (MOM) capacitors is provided. The integrated circuit structure includes a semiconductor substrate; a first metallization layer over the semiconductor substrate; first metal features in the first metallization layer; a second metallization layer over the first metallization layer; second metal features in the second metallization layer, wherein the first and the second metal features are non-capacitor features; a MOM capacitor having an area in at least one of the first and the second metallization layers; and an air-gap in the first metallization layer and between the first metal features.

15 Claims, 6 Drawing Sheets

MOM CAPACITORS INTEGRATED WITH AIR-GAPS

TECHNICAL FIELD

This invention relates generally to semiconductor devices, and more particularly to layout designs and manufacturing methods of metal-oxide-metal capacitors.

BACKGROUND

Capacitors are widely used in integrated circuits. One of the most commonly used capacitors is the metal-insulator-metal (MIM) capacitor. FIG. 1 illustrates a typical MIM capacitor, which includes bottom plate 2, top plate 6, and insulation layer 4 therebetween. Bottom plate 2 and top plate 6 are formed of conductive materials.

As is known in the art, the capacitance of a capacitor is proportional to its area and the dielectric constant (k) of the insulation layer, and is inversely proportional to the thickness of the insulation layer. Therefore, to increase the capacitance, it is preferable to increase the area and k value and to reduce the thickness of the insulation layer. However, the thickness and k value are often limited by the technology used for forming the capacitor. For example, the thickness of the insulation layer is limited by the breakdown voltage. On the other hand, since the MIM capacitors are often formed in low-k dielectric layers, the ability to increase the k value is also limited.

Methods for increasing the area of the capacitor have also been explored. A problem associated with increased area is that greater chip area is required. This dilemma is solved by the introduction of vertical (multi-layer) capacitors, often referred to as metal-oxide-metal (MOM) capacitors. A typical vertical MOM capacitor 10 is shown in FIG. 2, which is a perspective view. Capacitor 10 includes metal electrodes 12 and 14 separated by dielectric materials 18. Each of the metal electrodes 12 and 14 forms a three-dimensional structure. For clarity, metal electrode 12 is shown as un-patterned, and metal electrode 14 is patterned with dots.

Each of the metal electrodes 12 and 14 includes more than one layer connected by vias, and each layer is formed in a metallization layer commonly used for the formation of interconnect structures. In addition to the capacitance in each of the metallization layers, the capacitance of capacitor 10 also includes portions created by the overlap between the different layers, and the overlapped portions contribute to the total capacitance of capacitor 10.

It is realized that different integrated circuits may have different requirements for the design of MOM capacitors. For example, some integrated circuits require the MOM capacitors to occupy as small a chip area as possible and are less demanding in the capacitances of the MOM capacitors. Conversely, other integrated circuits demand great capacitances and are relatively less demanding in chip area usage. The manufacturing cost is also an issue to be considered. New MOM structures to suit different requirements are thus needed.

SUMMARY OF THE INVENTION

In accordance with one aspect of the present invention, an integrated circuit structure includes a semiconductor substrate; a first metallization layer over the semiconductor substrate; first metal features in the first metallization layer; a second metallization layer over the first metallization layer; second metal features in the second metallization layer, wherein the first and the second metal features are non-capacitor features; a MOM capacitor having an area in at least one of the first and the second metallization layers; and an air-gap in the first metallization layer and between the first metal features.

In accordance with another aspect of the present invention, an integrated circuit structure includes a semiconductor substrate; a first metallization layer over the semiconductor substrate, wherein the first metallization layer and underlying metallization layers are each an air-gap containing layer; a second metallization layer immediately over the first metallization layer, wherein the second metallization layer and overlying metallization layers are substantially free from air-gaps; and a MOM capacitor including a first layer in the first metallization layer. Both the first layer of the MOM capacitor and a region of the first metallization layer outside of the first layer include air-gaps.

In accordance with yet another aspect of the present invention, an integrated circuit structure includes a semiconductor substrate; a first region and a second region over the semiconductor substrate; a plurality of metallization layers over the semiconductor substrate, wherein each of the plurality of metallization layer comprises a first portion in the first region and a second portion in the second region, and wherein the first portion is substantially air-gap free and the second portion comprises air-gaps; and a MOM capacitor in the first region.

The advantageous features of the present invention include flexible design to suit different design requirements, improved capacitance, and reduced RC delay.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiment of the present invention, metal-oxide-metal (MOM) capacitors combined with air-gaps are formed. Throughout the description, the term "MOM capacitor" is used to refer to a capacitor that has an insulator between two conductive plates, wherein the insulator may include dielectric materials other than oxides, although oxides may also be used. Throughout the various views and illustrative embodiments of the present invention, like reference numbers are used to designate like elements.

Figure 1:
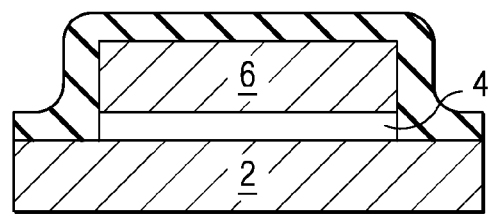
FIG. 1 illustrates a conventional metal-insulator-metal capacitor.
Figure 2:
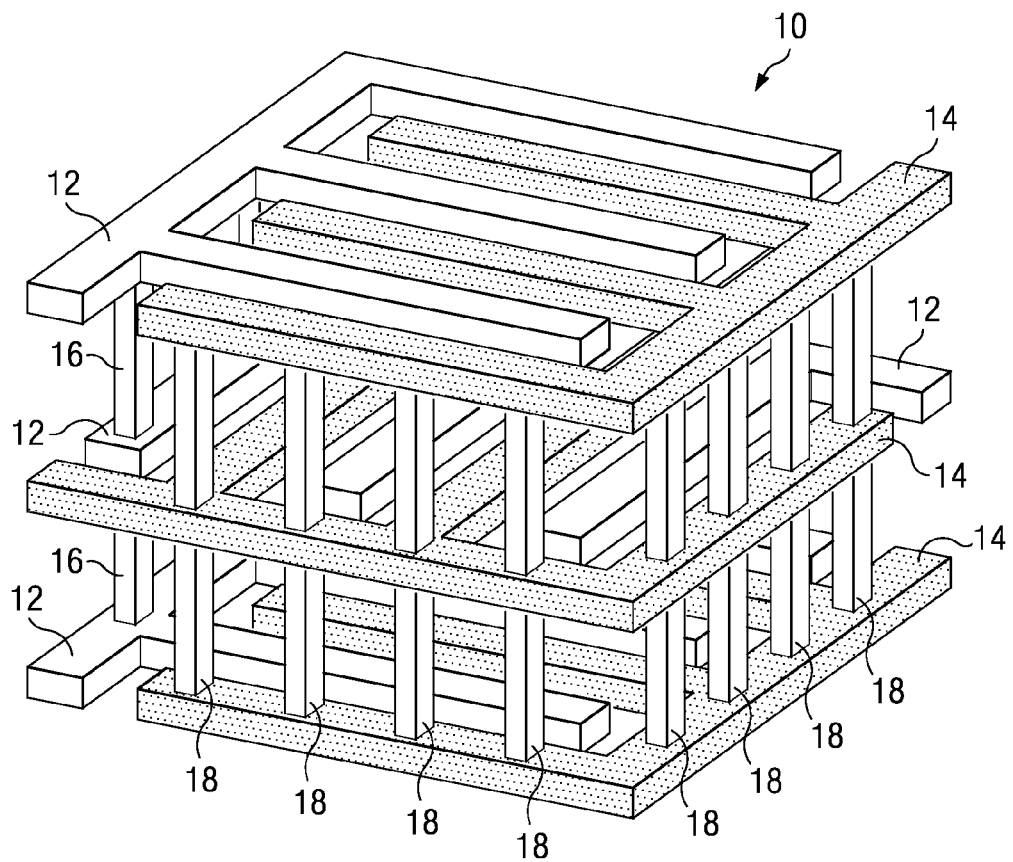
FIG. 2 illustrates a conventional metal-oxide-metal capacitor.
Figure 3:
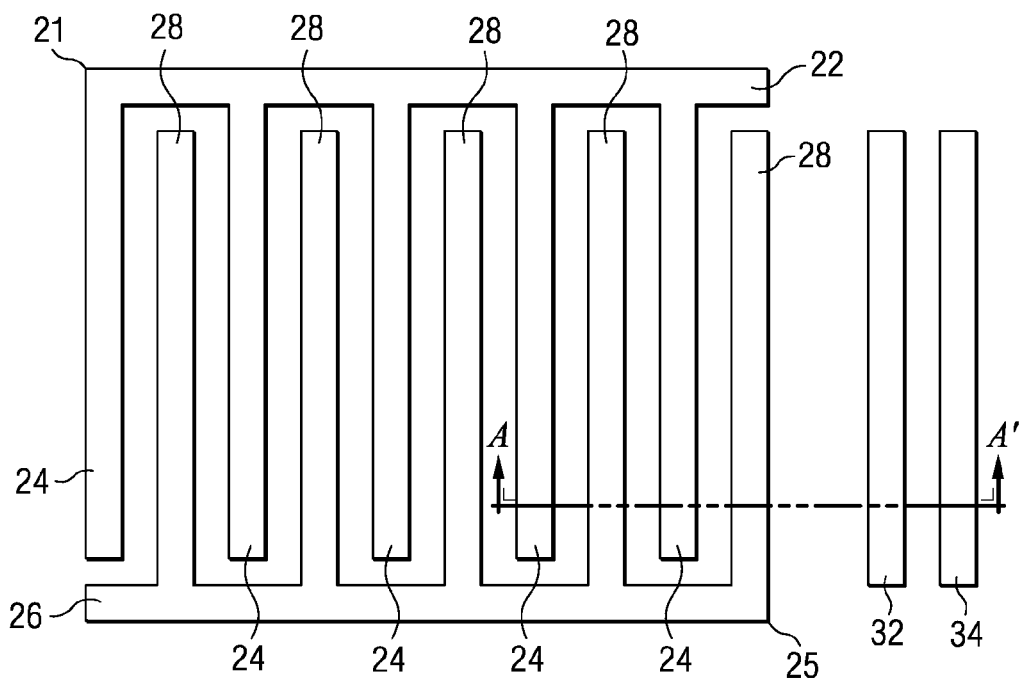
FIGS. 3 and 4 are top views of an embodiment of the present invention.

FIG. 3 illustrates a top view of a layer of MOM capacitor 20. MOM capacitor 20 includes two electrodes, also sometimes referred to as capacitor plates, 21 and 25. MOM capacitor 20 preferably expands through multiple metallization layers, although it also can be formed in only one of the metallization layers. Accordingly, electrodes 21 and 25 may be repeated in multiple metallization layers, and the electrodes in different metallization layers are interconnected. One skilled in the art will realize the connection scheme of the electrodes in different layers. It is appreciated that the MOM capacitor 20 shown in FIG. 3 is only an example, and there are various different forms of MOM capacitors.

Capacitor plate 21 includes fingers 24 and bus 22 for connecting all the fingers 24. Capacitor plate 25 includes fingers 28 and bus 26 for connecting fingers 28. Fingers 24 and 28 are placed in an alternating pattern with very small spaces between neighboring fingers. Therefore, each finger 24 or 28 forms a sub capacitor(s) with its neighboring fingers 28 or 24, or bus 25 or 21. The total capacitance is equivalent to the sum of the sub capacitors.

FIG. 3 also illustrates metal lines 32 and 34, which are parallel to each other. Metal lines 32 and 34 are not portions of any MOM capacitor, and are used for interconnection purposes. Metal lines 32 and 34 may be in a logic region or a peripheral region. Throughout the description, the region in which the MOM capacitor resides is referred to as a MOM region (or capacitor area), while the region where metal lines 32 and 34 resides is referred to as a non-MOM region (or non-capacitor area). It is noted that metal lines 32 and 34 may form parasitic capacitors with neighboring conductive features. However, these parasitic capacitors are typically far smaller in capacitance than the MOM capacitors, and hence metal lines 32 and 34 will not be considered as components of capacitors.

Figure 4:
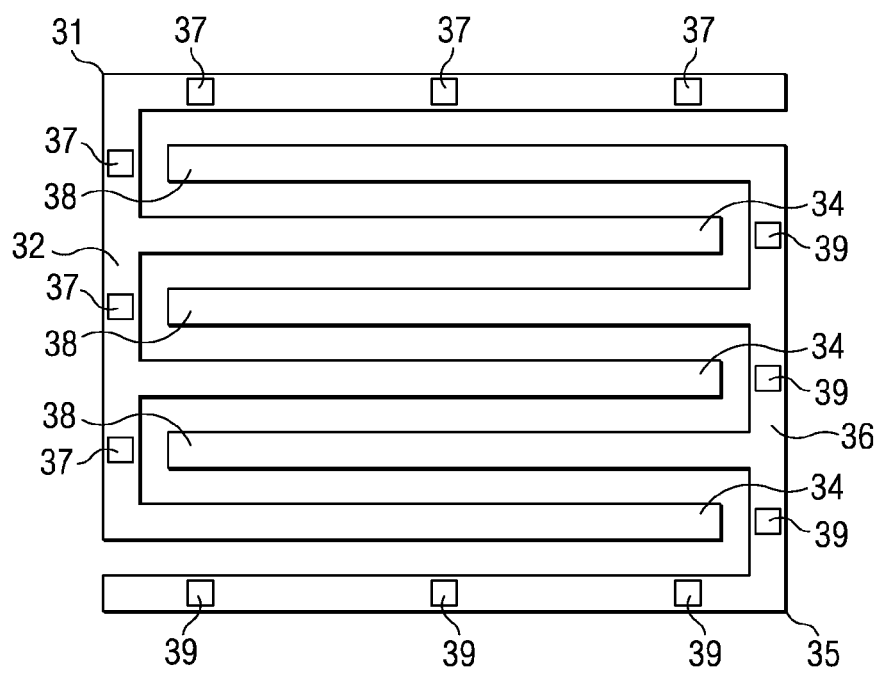

FIG. 4 illustrates a top view of another layer of MOM capacitor 20, which is in a second metallization layer overlying or underlying the first metallization layer. In an embodiment, the direction of the fingers in the second metallization layer is orthogonal to the direction of fingers in the first metallization layer. Alternatively, the directions of the fingers in the first and the second metallization layers are parallel. Similarly, capacitor plate 31 in the second metallization layer includes bus 32 and a plurality of fingers 34, and capacitor plate 35 in the second metallization layer includes bus 36 and a plurality of fingers 38. Typically, the buses in all the layers have similar shapes and sizes and are vertically overlapped. Vias 37 connect capacitor plates 21 and 31 in neighboring metallization layers, thereby forming an integral electrode. Similarly, vias 39 connect capacitor plates 25 and 35 in neighboring metallization layers, thereby forming another integral electrode.

Figure 5:
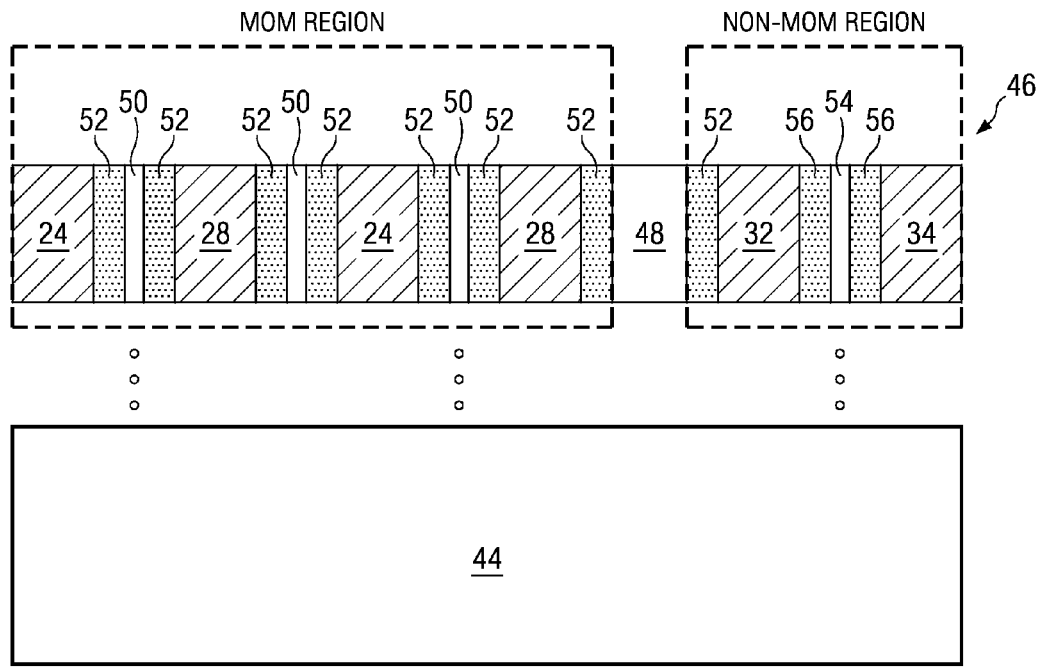
FIGS. 5 and 6 are cross-sectional views of embodiments of the present invention illustrating air-gaps formed in metallization layers.

Figures discussed in the following paragraphs, unless specified otherwise, are cross-sectional views of the structure shown in FIG. 3, wherein the cross-sectional view is taken along line A-A'. FIG. 5 illustrates a cross-sectional view of one of the metallization layers that is over semiconductor substrate 44. As is known in the art, active devices such as transistors (not shown) may be formed on the surface of semiconductor substrate 44. The metallization layers, such as metallization layer 46 as shown, include dielectric layer 48, and metal features, such as capacitor fingers 24 and 28, formed in dielectric layer 48. The top surfaces of the metal features in a metallization layer may be substantially level with the top surfaces of the dielectric material in the same metallization layer, and the bottom surfaces of the metal features in a metallization layer may be substantially level with the bottom surfaces of the dielectric material in the same metallization layer. Dielectric layer 48 is preferably formed of a low-k dielectric material having a dielectric constant (k value) of less than about 3.9, and more preferably less than about 2.5. The metal features, such as capacitor fingers 24 and 28, are preferably formed of copper or copper alloys, and a diffusion barrier (not shown) including titanium, titanium nitride, tantalum, tantalum nitride, or the like may be formed to separate the metal features from the low-k dielectric material.

In the MOM region, each of the regions between capacitor fingers 24 and 28 may be horizontally divided into three regions, two regions 52 that are adjacent capacitor fingers 24 and 28, and region 50 between regions 52. In the non-MOM region, the region between metal lines 32 and 34 may also be horizontally divided into regions 54 and 56. Metal features, such as fingers 24 and 28 and metal lines 32 and 34, may be formed using commonly known damascene processes, which include etching dielectric layer 48 to form openings/trenches, filling the openings/trenches with metallic materials, and performing a chemical mechanical polish to remove excess material. The formation of the openings/trenches involves ashing processes, which cause damage to regions 52 and 56. As a result, regions 52 and 56 may have different etching characteristics than regions 50 and 54. Also, the k value of regions 52 and 56 will increase. Air-gaps may thus be formed in regions 52 and 56 by selectively removing the damaged low-k dielectric materials. Since the k value of air-gaps is 1, the parasitic capacitance between metal lines 32 and 34, and hence the corresponding RC delay, is reduced. However, the formation of air-gaps also causes an adverse reduction in the capacitance between capacitor fingers 24 and 28. Therefore, this embodiment is preferably used in the applications sensitive to RC delays. The reduction caused by the air-gaps may also be compensated by increasing the number of layers and/or the area of capacitor 20. In this embodiment, since the features in the MOM region and the non-MOM region are manufactured simultaneously, the manufacturing cost is relatively low.

In alternative embodiments of the present invention, regions 50 and 54 are air-gaps, which are formed by selectively removing the dielectric materials in regions 50 and 54. In yet other embodiments, the dielectric materials in regions 50, 52, 54 and 56 are all removed, thereby forming air-gaps with greater sizes.

Figure 6:
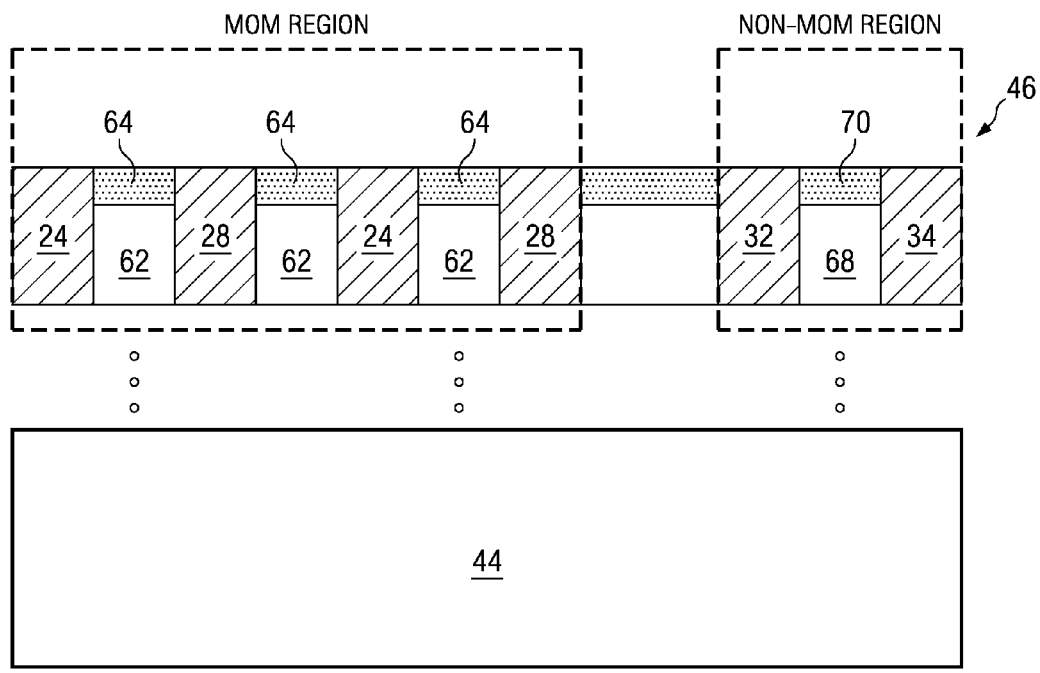

FIG. 6 illustrates an alternative embodiment, wherein the regions between capacitor fingers 24 and 28 can be vertically divided into regions 62 and 64. Similarly, the region between metal lines 32 and 34 can be vertically divided into regions 68 and 70. In an embodiment, regions 64 and 70 are air-gaps, while regions 62 and 68 are filled with a dielectric material, which may be a low-k dielectric material. An exemplary air-gap formation process includes filling regions 64 and 70 with a thermal-decomposable dielectric material, forming a permeable hard mask (not shown) over the thermal-decomposable dielectric material, and heating the substrate, so that the thermal-decomposable dielectric material is evaporated through the permeable hard mask. In another exemplary embodiment, regions 62 and 68 are air-gaps, and regions 64 and 70 may be formed of permeable materials. In yet other exemplary embodiments, substantially all dielectric materials in regions 62, 64, 68 and 70 are removed, and hence capacitor fingers 24 and 28 and metal lines 32 and 34 are separated from each other substantially only by air-gaps.

In FIGS. 5 and 6, the air-gaps cause a reduction in effective k values of dielectric regions. Preferably, an air-gap will cause the effective k value of the dielectric region between two conductive features to be reduced by greater than about 15% over the same dielectric region having no air-gaps. In the subsequently discussed FIGS. 7 through 9, when an air-gap is referred to, the air-gap may have any of the forms shown in FIGS. 5 and 6.

Figure 7:
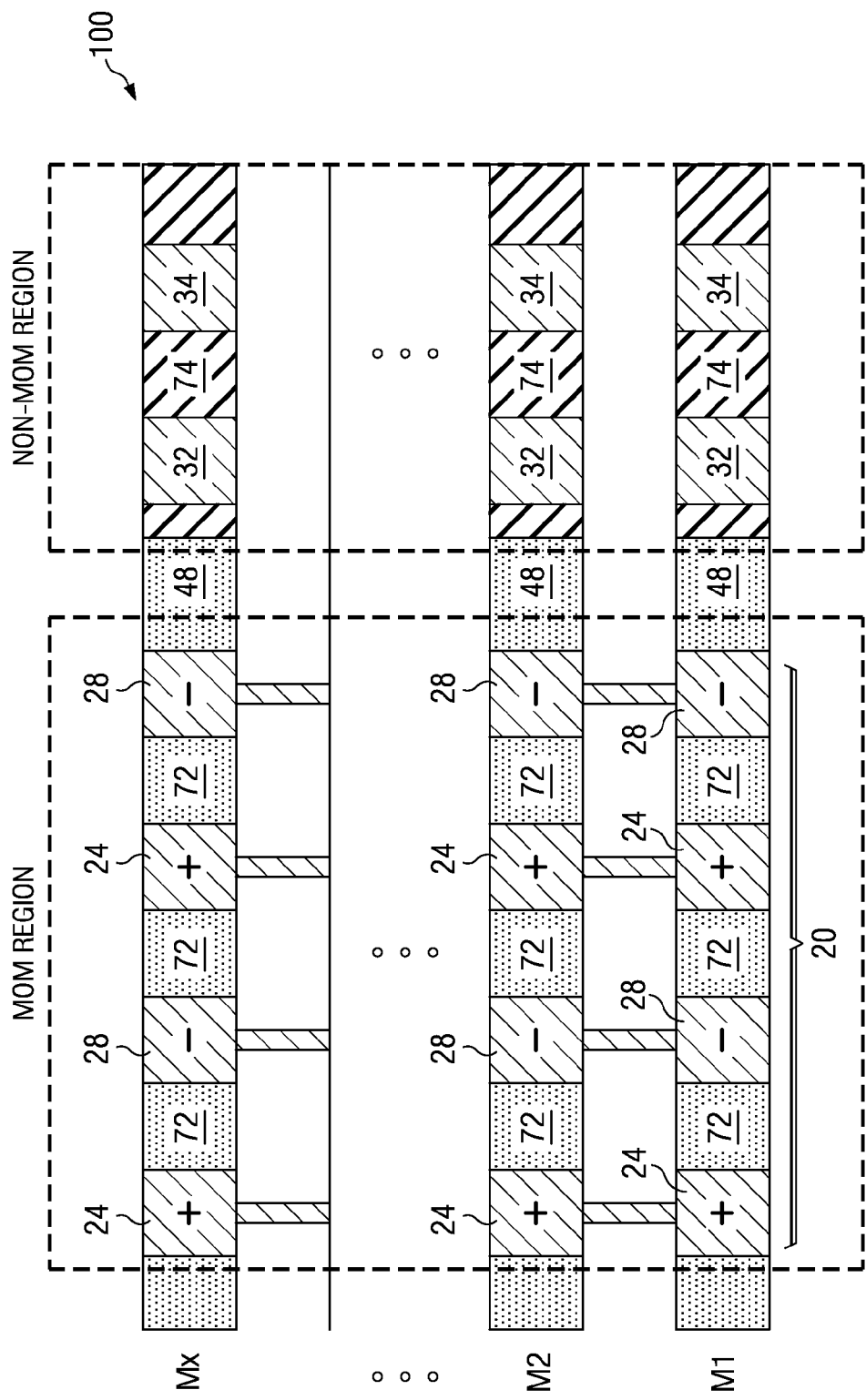
FIGS. 7 through 9 are cross-sectional views of embodiments of metal-oxide-metal capacitors combined with air-gaps.

Referring to FIG. 7, integrated circuit structure 100 includes a plurality of metallization layers M1 through Mx, wherein layer M1 is the bottom metallization layer, and layer Mx may be the top metallization layer or an intermediate metallization layer. The letter "x" represents an integer equal to or greater than one. Capacitor 20 extends from metallization layer M1 to metallization layer Mx, wherein the capacitor fingers 24 marked with "+" signs are interconnected, and capacitor fingers 28 marked with "−" signs are interconnected. The regions 72 between fingers 24 and 28 are substantially free from air-gaps. Conversely, in the non-MOM region, the regions 74 between metal lines 32 and 34 include air-gaps. Advantageously, with air-gaps in the non-MOM region, the parasitic capacitance between metal lines 32 and 34 is reduced. On the other hand, being substantially air-gap free, the capacitance of capacitor 20 is not adversely affected by the air-gap formation processes.

To form a structure as shown in FIG. 7, the MOM region may be masked when the non-MOM region is etched for forming air-gaps. Alternatively, both the MOM region and the non-MOM region are etched, and hence air-gaps are formed in both areas. Subsequently, a mask (not shown) is formed to cover the non-MOM region, and a dielectric material, preferably having a relatively high k value, for example, greater than about 1.5, is deposited into the air-gaps in the MOM region. The mask is then removed, and a chemical mechanical polish is performed to remove excess dielectric material.

The k value of dielectric materials in regions 72 may be increased further. In a first example (not shown), a mask is formed to cover the non-MOM region, and a nitridation is performed on the MOM region to increase the k value of regions 72. Accordingly, the k value of regions 72 is greater than the k value of dielectric layer 48 and the effective k value in regions 74. In a second embodiment (also not shown), the k value of regions 72 is increased by the formation of OH terminals, which may be formed by treating the integrated circuit structure 100 in an $H_2O$ (for example, moisture) containing environment. The treatment is preferably a plasma treatment or a thermal treatment. Alternatively, a silane treatment is performed. In a third embodiment (also not shown), the k value of regions 72 is increased by implanting species such as nitrogen, carbon, oxygen, and the like. The resulting k value of regions 72 is preferably greater than about 2.0.

Figure 8:
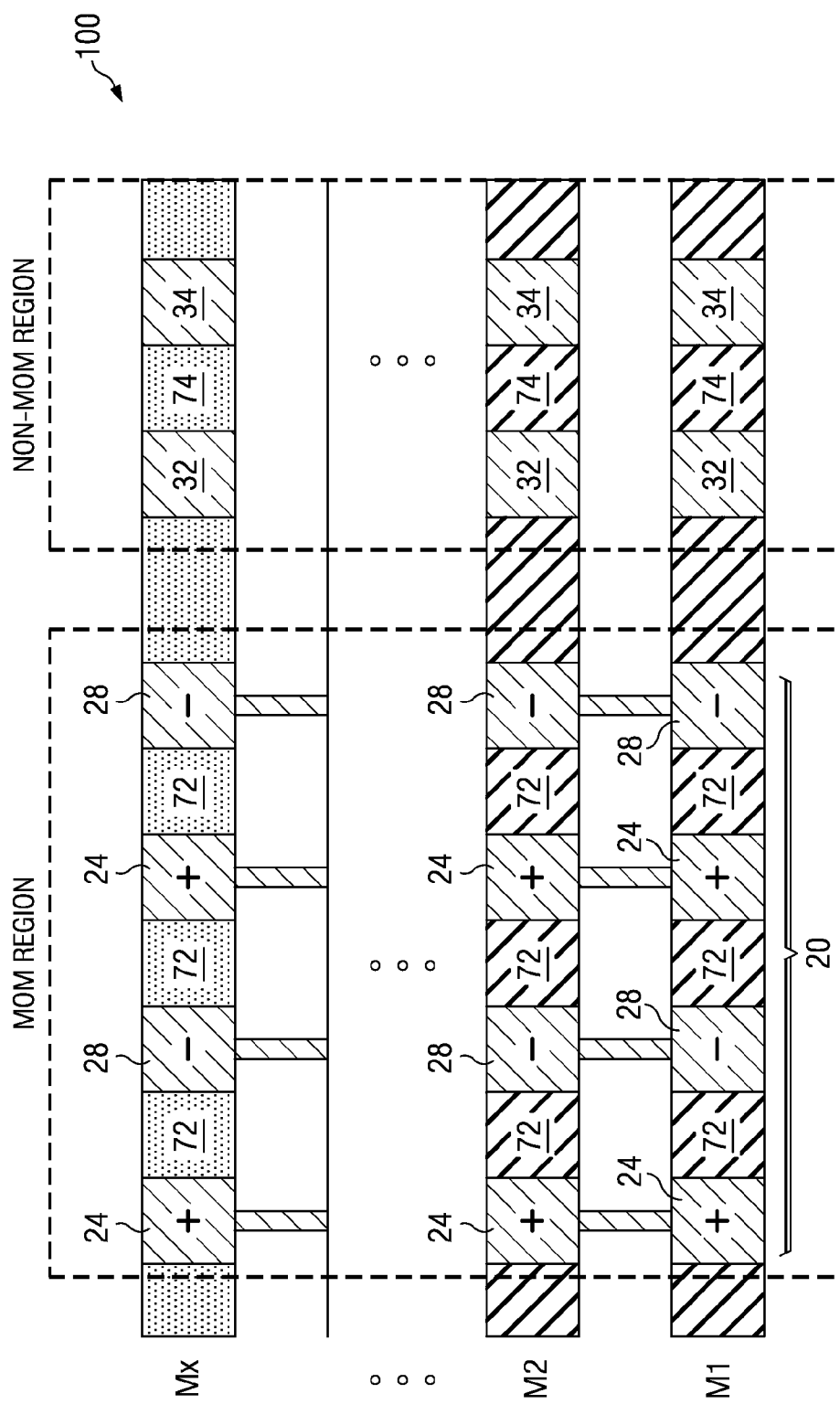

Typically, lower metallization layers have smaller pitches than higher metallization layers, and hence the RC delay caused by the parasitic capacitance in the lower metallization layers is more significant. FIG. 8 illustrates an embodiment wherein one or more of the lower metallization layers (e.g., metallization layers M1 and M2) includes air-gaps, which are formed in both regions 72 in the MOM region and regions 74 in the non-MOM region. Conversely, the upper metallization layers (e.g., metallization layer Mx) are free from air-gaps. Since MOM capacitor 20 may extend from lower metallization layers to upper metallization layers, capacitor 20 may include both the portions (layers) having air-gaps, and the portions (layers) free from air-gaps. Forming air-gaps across an entire metallization layer without distinguishing the MOM region and the non-MOM region reduces the manufacturing cost, even though the capacitance provided by the lower metallization layers is reduced.

Although FIGS. 7 and 8 show that the bottom layer of capacitor 20 is in the bottom metallization layer M1, it is appreciated that the bottom layer of capacitor 20 can be in any of the metallization layers.

Figure 9:
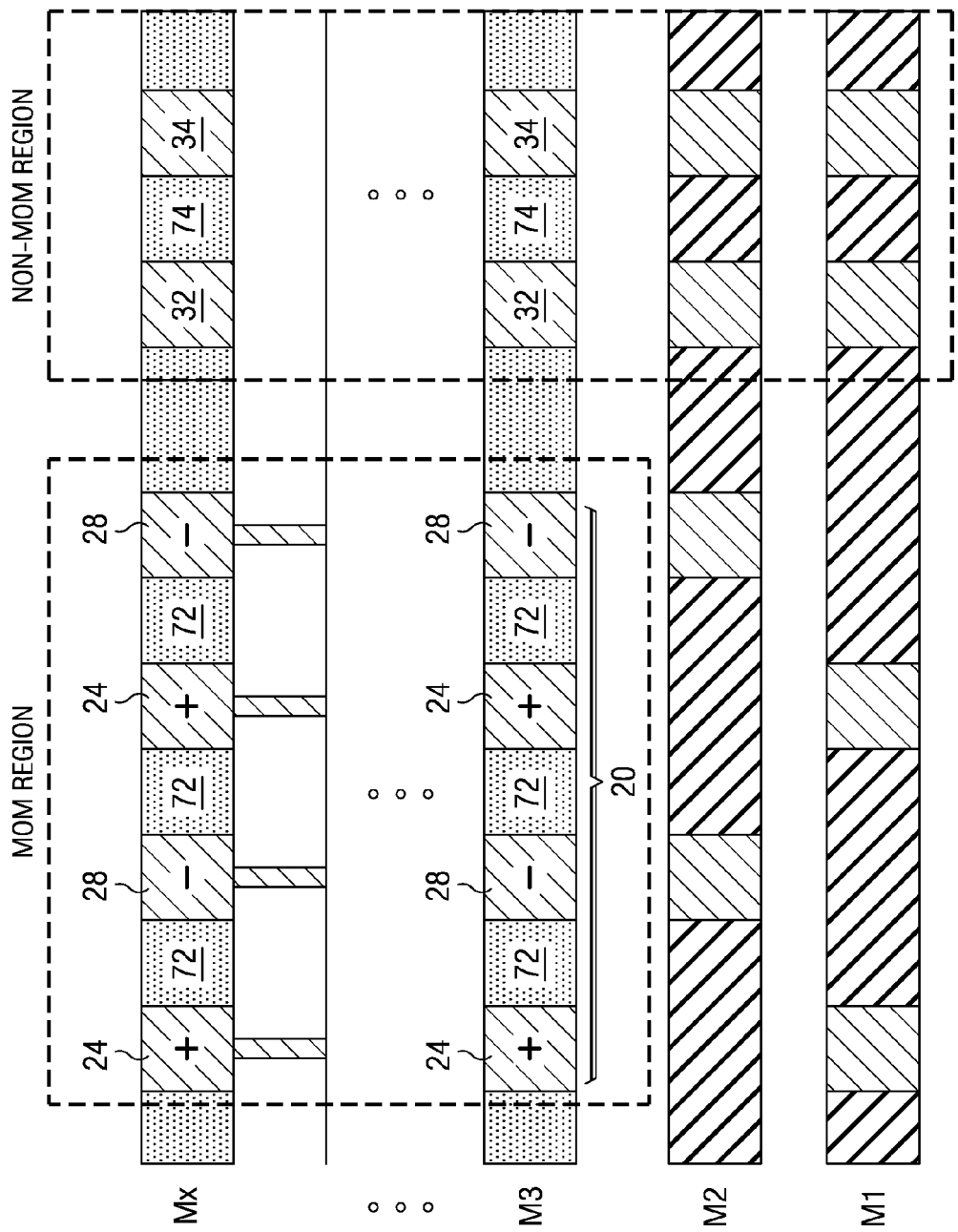

FIG. 9 illustrates yet another embodiment of the present invention. Preferably, air-gaps are formed throughout lower metallization layers. Upper metallization layers, such as metallization layer M3 and above, are free from air-gaps. Capacitor 20 is formed only in the metallization layers free from air-gaps. As discussed in the preceding paragraphs, the RC delay caused by the parasitic capacitance in lower metallization layers, such as metallization layers M1 and M2, are more significant; accordingly, forming air-gaps in the lower metallization layers has a better effect in reducing RC delay. In the meantime, by forming capacitor 20 only in upper metallization layers, the adverse decrease to the capacitance of MOM capacitor 20 due to air-gaps is eliminated.

It is appreciated that the embodiments in FIGS. 7 through 9 each have their advantageous and disadvantageous features, and may be suitable for different design requirements. For example, the embodiment shown in FIG. 7 may be used for high performance applications with high requirements on capacitance and chip area usage, while manufacturing cost is not a big concern. The embodiment shown in FIG. 8 may be used for applications requiring low manufacturing cost, and the embodiment shown in FIG. 9 may be used for applications having dense interconnection structures.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor substrate;
   a first metallization layer over the semiconductor substrate and having a substantially flat top surface and a substantially flat bottom surface, the first metallization layer comprising:
   dielectric regions; and
   metal features between the dielectric regions, wherein top surfaces of the metal features are substantially level with top surfaces of the dielectric regions, and bottom surfaces of the metal features are substantially level with bottom surfaces of the dielectric regions;
   a metal-oxide-metal (MOM) capacitor comprising first plurality of capacitor fingers in the first metallization layer; and
   a first air-gap in the first metallization layer and between the metal features, wherein the first air-gap is not between the first plurality of capacitor fingers.

2. The integrated circuit structure of claim 1, wherein the MOM capacitor further comprises a second plurality of capacitor fingers in a second metallization layer over the first metallization layer, and wherein no air-gap exists between the second plurality of capacitor fingers.

3. The integrated circuit structure of claim 2, wherein no air-gap is formed between the first plurality of capacitor fingers.

4. The integrated circuit structure of claim 3, wherein no air-gap exists between any two capacitor fingers of the MOM capacitor in any metallization layer over the semiconductor substrate.

5. The integrated circuit structure of claim 2 further comprising
a first dielectric material between the first plurality of capacitor fingers; and
a second dielectric material in the first metallization layer and not between any capacitor finger of any capacitor, wherein the second dielectric material is different from the first dielectric material.

6. The integrated circuit structure of claim 5, wherein the first dielectric material has a k value of greater than about 1.5.

7. The integrated circuit structure of claim 1, wherein the MOM capacitor further comprises a second plurality of capacitor fingers in a second metallization layer over the first metallization layer, and wherein a second air-gap exists between the second plurality of capacitor fingers.

8. The integrated circuit structure of claim 1 further comprising a second metallization layer immediately under the first metallization layer, with no air-gaps being formed in the second metallization layer and all metallization layers under the second metallization layer and over the semiconductor substrate, wherein air-gaps are formed in each of the first metallization layer and all metallization layers over the first metallization layer.

9. An integrated circuit structure comprising:
a semiconductor substrate;
a first metallization layer over the semiconductor substrate, wherein each of the first metallization layer and all metallization layers under the first metallization layer is an air-gap containing layer, and wherein the first metallization layer has a substantially flat first bottom surface, with the first bottom surface comprising bottom surfaces of dielectric regions in the first metallization layer and bottom surfaces of metal features in the first metallization layer;
a second metallization layer immediately over the first metallization layer, wherein the second metallization layer and all metallization layers over the second metallization layer are substantially free from air-gaps, and wherein the second metallization layer has a substantially flat second bottom surface, with the second bottom surface comprising bottom surfaces of dielectric regions in the second metallization layer and bottom surfaces of metal features in the second metallization layer; and
a metal-oxide-metal (MOM) capacitor comprising a first portion in the first metallization layer, wherein a first air-gap is located in the first metallization layer and between two capacitor fingers of the MOM capacitor; and
a second air-gap in the first metallization layer and outside the MOM capacitor.

10. The integrated circuit structure of claim 9, wherein the MOM capacitor further comprises a second portion in the second metallization layer.

11. The integrated circuit structure of claim 9, wherein the first metallization layer is a metallization layer (M2) immediately over a bottom metallization layer (M1).

12. The integrated circuit structure of claim 9, wherein the first portion of the MOM capacitor comprises capacitor fingers and a dielectric material between the capacitor fingers, and wherein the dielectric material comprises an element selected from the group consisting essentially of silicon, carbon, and combinations thereof.

13. An integrated circuit structure comprising:
a semiconductor substrate;
a metallization layer over the semiconductor substrate, wherein the metallization layer comprises dielectric regions and metal features, with top surfaces of the dielectric regions and the metal features level with each other, and bottom surfaces of the dielectric regions and the metal features level with each other;
a metal-oxide-metal (MOM) capacitor comprising portions of the metal features as capacitor fingers, wherein no air-gap is formed between the capacitor fingers; and
air-gaps in the metallization and not between the capacitor fingers of the MOM capacitor.

14. The integrated circuit structure of claim 13, wherein the MOM capacitor comprises a portion extending into a bottom metallization layer (M1).

15. The integrated circuit structure of claim 13, wherein the MOM capacitor comprises a dielectric material between the capacitor fingers, and wherein the dielectric material comprises an element selected from the group consisting essentially of silicon, carbon, and combinations thereof.

* * * * *